United States Patent
Hsu et al.

(10) Patent No.: US 10,199,323 B2
(45) Date of Patent: Feb. 5, 2019

(54) FLEXIBLE CIRCUIT SUBSTRATE WITH TEMPORARY SUPPORTS AND EQUALIZED LATERAL EXPANSION

(71) Applicant: Apple Inc., Cupertino, CA (US)

(72) Inventors: Yung-Yu Hsu, San Jose, CA (US); Hoon Sik Kim, San Jose, CA (US); Christopher A. Schultz, San Francisco, CA (US); David M. Kindlon, Lake Arrowhead, CA (US); Daniel D. Sunshine, Sunnyvale, CA (US); Paul S. Drzaic, Morgan Hill, CA (US); Sinan Alousi, Campbell, CA (US); Terry C. Shyu, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/415,496

(22) Filed: Jan. 25, 2017

(65) Prior Publication Data
US 2018/0061743 A1    Mar. 1, 2018

Related U.S. Application Data

(60) Provisional application No. 62/381,382, filed on Aug. 30, 2016.

(51) Int. Cl.
*H01L 23/498* (2006.01)
*H01L 25/075* (2006.01)
(Continued)

(52) U.S. Cl.
CPC .... *H01L 23/4985* (2013.01); *H01L 23/49838* (2013.01); *H01L 25/0753* (2013.01);
(Continued)

(58) Field of Classification Search
CPC ........... H01L 23/49838; H01L 23/4985; H01L 25/0753
See application file for complete search history.

(56) References Cited

U.S. PATENT DOCUMENTS

| | | | |
|---|---|---|---|
| 2002/0094701 A1* | 7/2002 | Biegelsen | B25J 13/084 439/32 |
| 2010/0116526 A1* | 5/2010 | Arora | H01L 23/4985 174/254 |

(Continued)

FOREIGN PATENT DOCUMENTS

| | | |
|---|---|---|
| CN | 205048218 U | 2/2016 |
| WO | 2016030578 | 3/2016 |

(Continued)

OTHER PUBLICATIONS

Mark et al., "Auxetic Metamaterial Simplifies Soft Robot Design", International Conference on Robotics and Automation, May 16-21, 2016, 4951-4956, Sweden.

*Primary Examiner* — Matthew C Landau
*Assistant Examiner* — Mark Hatzilambrou
(74) *Attorney, Agent, or Firm* — Treyz Law Group, P.C.; G. Victor Treyz; David K. Cole (57) ABSTRACT

An item may have a flexible support structure and may include a flexible component. The flexible component may have electrical components mounted on component mounting regions in a flexible circuit substrate. The component mounting regions may be interconnected by serpentine interconnect paths or other flexible interconnect paths. The flexible circuit substrate and component mounting regions may extend along a longitudinal axis of the flexible component or may form a two-dimensional array. Two-dimensional mesh-shaped flexible circuit substrates may be used in forming displays. The mesh-shaped flexible circuit substrates may be auxetic substrates that widen when stretched (Continued)

(e.g., structures with a negative Poisson's ratio that become thicker perpendicular to applied force when stretched) and that therefore reduce image distortion. Temporary tethers may help hold flexible circuit substrates together until intentionally broken following assembly of a flexible component into the flexible support structure.

15 Claims, 10 Drawing Sheets

(51) Int. Cl.
  *H01L 33/62* (2010.01)
  *H05K 1/02* (2006.01)
  *H05K 1/14* (2006.01)
  *G06F 3/041* (2006.01)

(52) U.S. Cl.
  CPC .......... *H01L 33/62* (2013.01); *H05K 1/0283* (2013.01); *H05K 1/148* (2013.01); *G06F 3/041* (2013.01); *H05K 2201/053* (2013.01); *H05K 2201/0909* (2013.01); *H05K 2201/09127* (2013.01); *H05K 2203/302* (2013.01)

(56) References Cited

U.S. PATENT DOCUMENTS

| | | |
|---|---|---|
| 2010/0149772 A1 | 6/2010 | Gass et al. |
| 2010/0330338 A1* | 12/2010 | Boyce .................... B29C 59/02 |
| | | 428/156 |
| 2011/0242638 A1 | 10/2011 | Horning et al. |
| 2014/0107495 A1 | 4/2014 | Marinelli et al. |
| 2015/0308634 A1* | 10/2015 | van de Ven ................ G09F 9/33 |
| | | 362/84 |
| 2015/0380355 A1 | 12/2015 | Rogers et al. |
| 2016/0181504 A1* | 6/2016 | Paschkewitz ........... H01L 35/34 |
| | | 438/54 |
| 2016/0268352 A1* | 9/2016 | Hong .................. H01L 27/3218 |
| 2017/0215284 A1* | 7/2017 | Ng ......................... H05K 1/118 |

FOREIGN PATENT DOCUMENTS

| | | |
|---|---|---|
| WO | 2016100218 A1 | 6/2016 |
| WO | 2016198312 A1 | 12/2016 |

* cited by examiner

FIG. 18

FLEXIBLE CIRCUIT SUBSTRATE WITH TEMPORARY SUPPORTS AND EQUALIZED LATERAL EXPANSION

This application claims the benefit of provisional patent application No. 62/381,382, filed Aug. 30, 2016, which is hereby incorporated by reference herein in its entirety.

BACKGROUND

This relates generally to components formed from flexible circuit substrates, and, more particularly, to items formed from components with flexible circuit substrates having regions interconnected by elongated interconnect paths.

Electrical components such as integrated circuits can be mounted on dielectric substrates. Signals may be routed between electrical components using metal traces on a dielectric substrate. Some substrates such as rigid printed circuit boards are inflexible. Other substrates such as flexible printed circuit substrates may bend, thereby allowing these substrates to be used in applications were the inflexible nature of rigid printed circuit boards would not be acceptable.

It can be challenging to form flexible circuit substrates with desired attributes. If care is not taken, a flexible circuit substrate may be insufficiently flexible or may be insufficiently robust. Flexible circuit substrates may also distort undesirably when stressed.

SUMMARY

An item may have a flexible support structure. The flexible support structure may be formed from a stretchable material such as fabric, elastomeric polymer, or other stretchable structures. The item may include a flexible component that is supported by the flexible support structure. For example, the item may have a flexible component that is embedded within a fabric structure or that is attached to an elastomeric plastic support. The flexible component may have a flexible circuit substrate. The flexible component may also have electrical components mounted on component mounting regions in the flexible circuit substrate. The component mounting regions may be interconnected by serpentine interconnect paths or other flexible interconnect paths in the flexible circuit substrate.

The flexible circuit substrate may have an elongated shape that extends along a longitudinal flexible component axis or may have a two-dimensional shape. The electrical components mounted on the component mounting regions of the flexible circuit substrate may include touch sensors and other sensors, light-based components such as light-emitting diodes, communications and control circuit, and other circuitry. Two-dimensional mesh-shaped flexible circuit substrates may be used in forming displays. The mesh-shaped flexible circuit substrates may be auxetic substrates that widen when stretched (e.g., structures with a negative Poisson's ratio that become thicker perpendicular to applied force when stretched). A flexible component such as a flexible display that uses an auxetic substrate may exhibit reduced image distortion.

Temporary tethers may help hold flexible circuit substrates together until intentionally broken following assembly of a flexible component and flexible support structure to form an item. The temporary tethers may be formed from integral portions of a flexible circuit substrate or separate structures and may have selectively narrowed portions to facilitate splitting the tethers in known locations.

DETAILED DESCRIPTION

Figure 1:
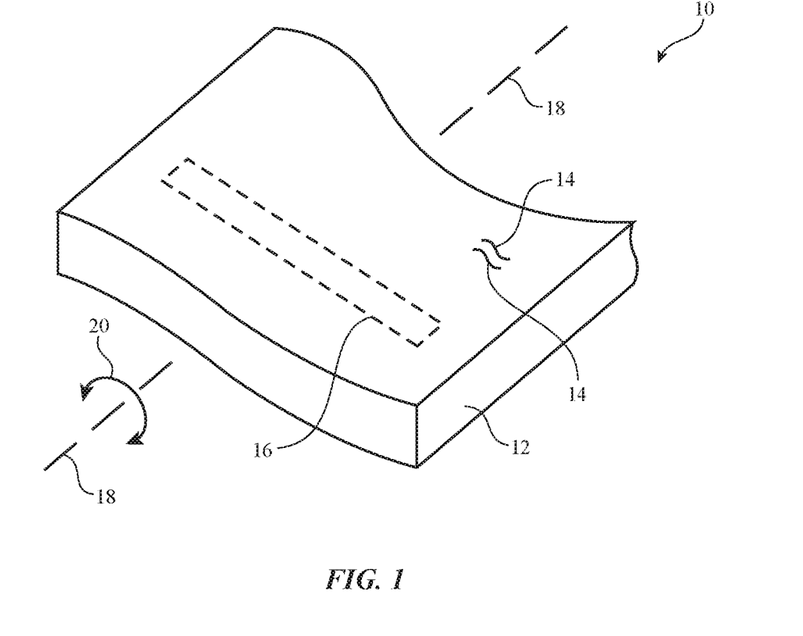
FIG. 1 is a diagram of an illustrative item of the type that may include circuitry mounted on a flexible circuit substrate in accordance with an embodiment.

An illustrative item that may include a component formed from a flexible circuit substrate is shown in FIG. 1. As shown in FIG. 1, item 10 may be formed from support structure 12. Support structure 12 may include one or more layers of fabric or other material that includes strands of material such as strands 14 (e.g., insulating and/or conductive yarn), may be formed from sheets of plastic, molded or machined plastic structures, metal structures, structures formed from fiber-composite material, and/or structures formed from other materials. Structure 12 may form a wearable item (e.g., a band to be worn on a user's wrist), may form an electronic device housing (e.g., a housing for a cellular telephone, laptop computer, tablet computer, or other electronic device), may form a case or cover for an electronic device, and/or may form other suitable items. If desired, item 10 may be flexible. For example, structure 12 may be flexed in directions 20 about bend axis 18. Structures 12 may also be deformed in other directions (e.g., by stretching).

One or more components such as illustrative component 16 may be supported by support structure 12. For example, component 16 may be embedded within structure 12 (e.g., component 16 may be received within a pocket between adjacent fabric layers, may be mounted in a recess in a plastic or metal structure, may be attached to an interior and/or exterior portion of structure 12 using adhesive, or may otherwise be incorporated into structure 12). To accommodate deformation of structure 12, component 16 may be formed from a flexible circuit substrate.

Figure 2:
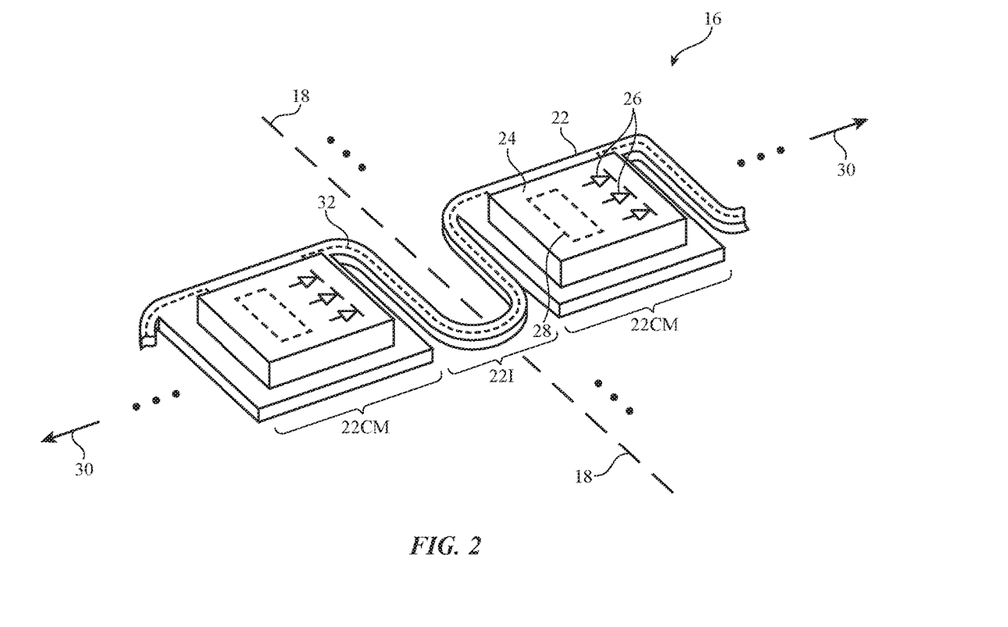
FIG. 2 is a perspective view of circuitry on a flexible circuit substrate having component mounting regions interconnected by stretchable elongated serpentine interconnect paths in accordance with an embodiment.

An illustrative flexible electronic component formed from a flexible circuit substrate is shown in FIG. 2. As shown in the perspective view of FIG. 2, flexible electronic component 16 may be formed from flexible circuit substrate 22. Flexible circuit substrate 22 may be formed from a flexible dielectric material such as polyimide or other flexible polymer that allows component 16 to flex. Component 16 may, for example, stretch longitudinally outward in directions 30 (e.g., along a longitudinal axis associated with an elongated component such as illustrative component 16 of FIG. 2) and/or may bend about bend axis 18.

Electrical components 24 may include packaged and/or unpackaged integrated circuits or other semiconductor dies. Unpackaged circuits may be formed from bare silicon dies or other crystalline semiconductor dies. Packaged integrated circuits may be encapsulated within plastic packages. If desired, packaged circuits and/or unpackaged circuits may be mounted on interposer structures. Integrated circuit packages, interposers, and other structures for packaging and mounting circuitry associated with electrical components 24 may be formed from plastic, ceramic, and/or other dielectric materials.

Electrical components 24 may include devices for gathering input and/or supplying output. With one illustrative configuration, components 24 may include light-emitting diodes such as light-emitting diodes 26 and associated control and communications circuitry such as circuitry 28. Light-emitting diodes 26 may be formed from organic light-emitting diode structures or may be formed from crystalline semiconductor dies (e.g., light-emitting diodes 26 may be micro-LEDs). There may be any suitable number of light-emitting diodes 26 in each components 24 (e.g., one or more, two or more, three or more, etc.). The light-emitting diodes in each component 24 may be light-emitting diodes 26 of different colors such as red, green, and blue light-emitting diodes. In general, components 24 may be any suitable electrical components (e.g., integrated circuits, discrete components, light-emitting components, light sensors, touch sensor components such as capacitive touch sensor components, light-emitting and light-detecting touch sensor components, force sensors, temperature sensors, pressure sensors, moisture sensors, other sensors, haptic output devices, audio components, etc.). Illustrative configurations in which components 24 include at least some light-emitting components such as light-emitting diodes 26 and that optionally include touch sensor components may sometimes be described herein as an example. This is, however, merely illustrative. Components 24 may be any suitable electrical components mounted to flexible circuit substrate 22.

Flexible circuit substrate 22 may have component mounting regions such as component mounting regions 22CM that are interconnected by flexible interconnect paths (sometimes referred to as branches, arms, elongated segments, interconnects, etc.) such as flexible interconnect paths 22I. Signal routing lines 32 may be formed from metal traces in component mounting regions 22CM and interconnect paths 22I. Interconnect paths 22I may have serpentine shapes or other suitable elongated shapes (e.g., meandering elongated shapes, etc.) to promote stretching and bending without damaging signal routing lines 32. Components 24 may be soldered to signal path solder pads formed from metal traces in component mounting regions 22CM or may be coupled to signal lines 32 using other suitable conductive connections (e.g., conductive connections formed from welds, conductive adhesive, etc.). Component mounting regions 22CM may be rectangular, circular, oval, may have shapes with combinations of curved and straight edges, or may have other suitable shapes.

Flexible circuit substrate 22 may be formed from a flexible polymer such as polyimide or other flexible dielectric. Substrate 22 may, for example, include one or more, two or more, or three or more sheets of laminated polyimide (as examples). Metal traces may be formed on one or both sides of substrate 22 and/or may be embedded between polyimide sublayers in substrate layer 22.

Component mounting regions 22CM may be arranged in a line (e.g., to form a one-dimensional array), may be tiled in two dimensions (e.g., to form a two-dimensional array having rows and columns), and/or may be organized in other suitable patterns. Light-emitting diodes 26 and other electrical devices associated with electrical components 24 may be used to create components 16 that serve as status indicator lights, displays that display images for a user, and/or other components 16. Components 24 that include sensors (e.g., capacitive touch sensing circuitry, force sensors, light-based touch sensors, etc.) can be formed in one-dimensional arrays (e.g., to serve as buttons or one-dimensional touch sensitive input devices) or may be formed in two-dimensional arrays (e.g., to form two-dimensional touch sensors). If desired, a two-dimensional mesh-shaped configuration may be used for substrate 22, components 24 may be mounted on a two-dimensional array of regions 22CM, and component 16 may form a two-dimensional touch sensitive display (as an example). Haptic devices may be incorporated into electrical components 24 to provide component 16 with haptic output capabilities.

Whether arranged to form a one-dimensional or two-dimensional array or other suitable flexible circuit configuration, flexible circuit substrate 22 may be delicate due to the presence of thin elongated structures such as interconnect paths 22I. To ensure that flexible circuit substrate 22 is sufficiently robust to withstand handling during assembly such as when being attached to support structure 12 of item 10 (FIG. 1), flexible circuit substrate 22 may be provided with temporary support structures such as breakable tethers 34 of FIG. 3. Tethers 34 may be formed from the same material as substrate 22 (e.g., polyimide) or may be formed from a different material (e.g., an organic or inorganic material that is coupled between opposing portions of substrate 22). Substrate 22 may be patterned using laser cutting, die cutting, etching, photoimaging (e.g., using a mask to expose and develop a photoimageable to form polymer substrate 22), printing and/or other suitable patterning techniques. During patterning, tethers 34 may be left in place in substrate 22 at locations that bridge gaps 36 between component mounting regions 22CM and interconnect paths 22I or at other suitable locations that help provide temporary support to substrate 22 (e.g., temporary coupling between component mounting regions 22M). Once component 16 has been mounted in structure 12, component 16 may be flexed or otherwise manipulated to break tethers 34 and thereby release serpentine interconnect paths 22I. This ensures that flexible circuit substrate 22 and component 16 will achieve its desired maximum flexibility during normal use of item 10.

Figure 3:
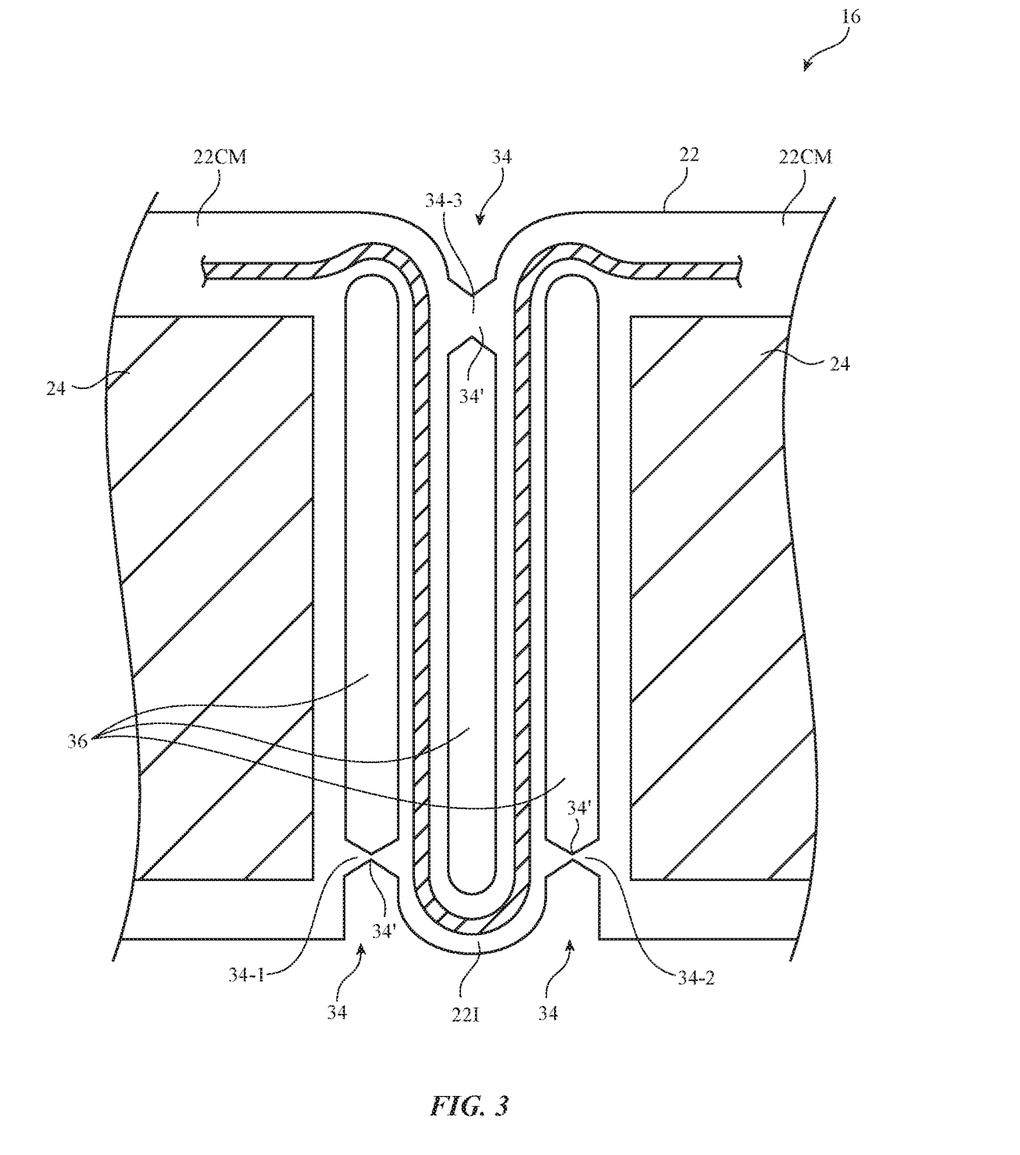
FIG. 3 is a top view of a pair of component mounting regions, an interposed serpentine interconnect path, and temporary support structures in accordance with an embodiment.

If desired, tethers 34 may have narrowed portions 34' or other selectively weakened portions. Narrowed portions 34' serve as stress concentrators that ensure that tethers 34 break in a controllable fashion at known locations during manufacturing. Tethers 34 may all have the same strength or different tethers within the set of tethers coupling together adjacent pairs of component mounting regions 22CM may have different strengths. Tethers of different strengths can be broken by applying progressively increasing amounts of force. In the example of FIG. 3, the widths of narrowed portions 34' increase progressively for tethers 34-1, 34-2, and 34-3. With this arrangement, tether 34-1 breaks relatively easily, tether 34-2 breaks with more difficulty than tether 34-2 and therefore breaks only after more force is applied than was applied to break tether 34-1, and tether 34-3 breaks when even more force is applied than was used to break tether 34-2. Different amounts of breaking force may be applied at different manufacturing stages so that component 16 has different amounts of flexibility at different stages.

Figure 4:
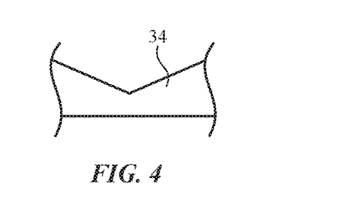
FIGS. 4, 5, 6, 7, 8, 9, 10, and 11 are illustrative temporary support structures in accordance with embodiments.
Figure 5:
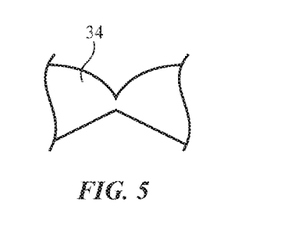
Figure 6:
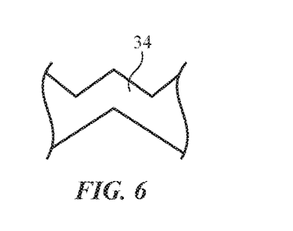
Figure 7:
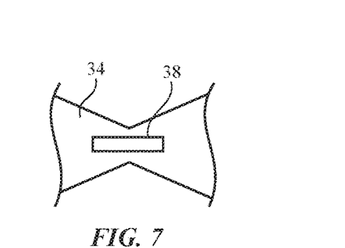
Figure 8:
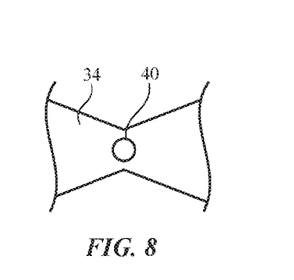
Figure 9:
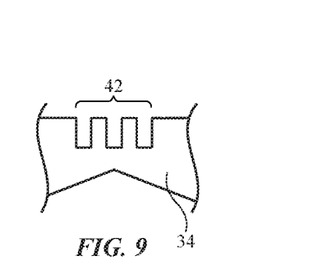
Figure 10:
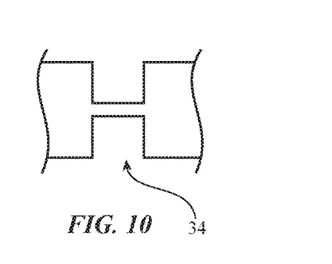
Figure 11:
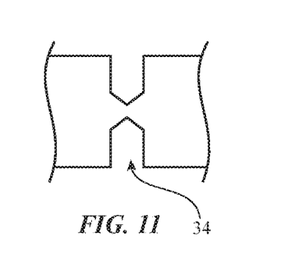

In the illustrative configuration of FIG. 3, tethers 34 have a bowtie shape with a narrowed central portion 34'. FIG. 4 shows how tether 34 may be narrowed from one side. Tether 34 of FIG. 5 has an edge with curved portions. FIG. 6 shows how tether 34 may have a sawtooth shape. In the example of FIG. 7, tether 34 has rectangular slot 38 that facilitates breakage. In the example of FIG. 8, tether 34 has an oval or teardrop shaped opening 40 that facilitates breakage. Tether 34 of FIG. 9 is selectively weakened by the presence of comb-shaped narrowing edge recesses 42. FIG. 10 shows how tether 34 may be narrowed using rectangular notches. Tether 34 of FIG. 11 has pointed notches.

Figure 12:
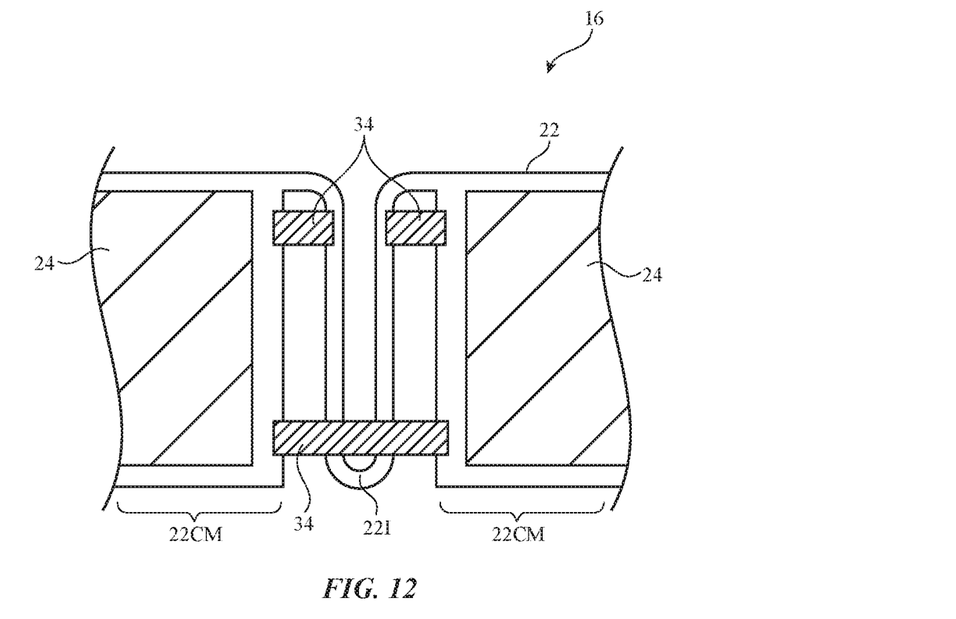
FIG. 12 is a diagram of an illustrative pair of component mounting regions formed from flexible circuit substrate material that have been coupled by temporary support structures that are separate from the flexible circuit substrate material in accordance with an embodiment.
Figure 13:
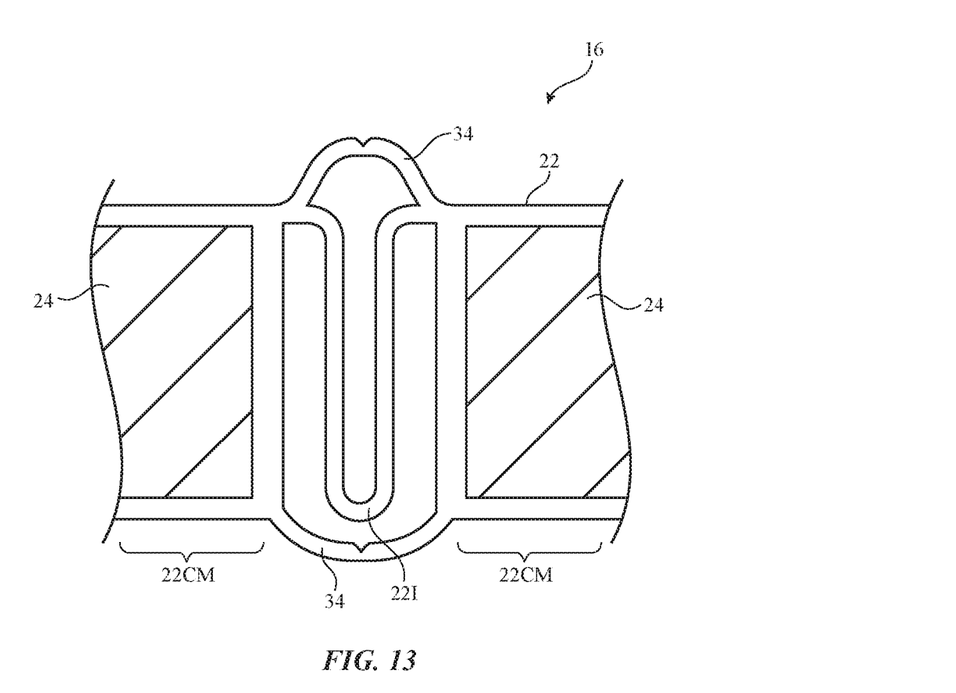
FIG. 13 is a diagram of an illustrative pair of component mounting regions formed from flexible circuit substrate material that have been coupled by temporary support structures that extend outwardly from the component mounting regions in accordance with an embodiment.

As shown in FIG. 12, tethers 34 may be formed from material that is separate from the material of flexible circuit substrate 22. Tethers 34 may, in general, be formed from plastic, metal, ceramic, printed material, material attached to substrate 22 by adhesive or other attachment mechanisms, or other suitable materials. If desired, tethers 34 may extend outwardly from component mounting regions 22CM, as shown in FIG. 13. The configurations of FIGS. 3, 4, 5, 6, 7, 8, 9, 10, 11, 12, and 13 are merely illustrative. In general, tethers 34 may have any suitable shapes or sizes and may be formed from integral portions of substrate 22 and/or one or more additional materials. Tethers 34 serve as temporary attachment structures that help hold component mounting regions 22CM together during assembly so that interconnect paths 22I are not damaged and may therefore sometimes be referred to as being sacrificial, breakable, temporary, etc.

Figure 14:
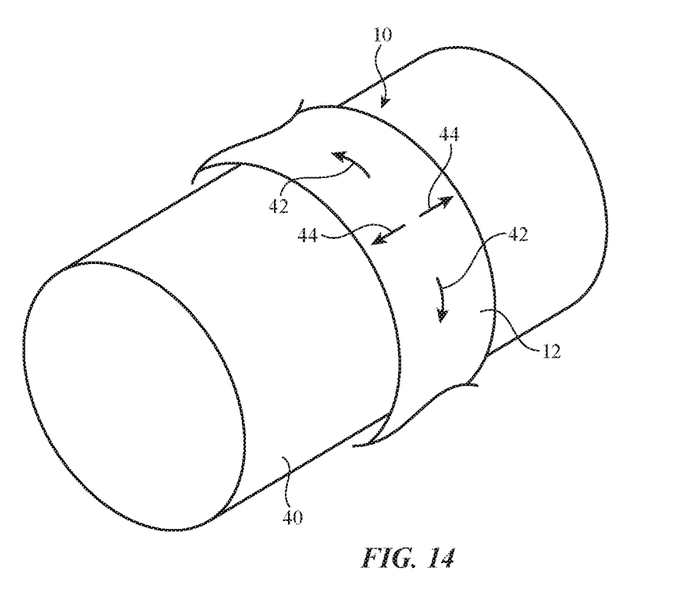
FIG. 14 is a perspective view of an illustrative stretchable item showing how the item may be formed from a flexible circuit substrate material that expands laterally in a direction that is perpendicular to a stretching direction in accordance with an embodiment.

FIG. 14 shows how item 10 may be stretchable. In the example of FIG. 14, structure 12 of item 10 is being stretched around a cylindrical object 40 in directions 42. Object 40 may be, for example, a wrist of a person, may be another human body part, may be an inanimate object, or may be any other suitable structure. In configurations such as those in which components 24 contain light-emitting diodes in a two-dimensional array to form a display that displays images for a user, distortion of displayed images may be undesirable. To prevent flexible circuit substrate 22 of item 10 from deforming in a way that distorts displayed images as item 10 is stretched along a first dimension (parallel to directions 42) flexible circuit substrate 22 (and, if desired, structure 12) may contain structures that expand outwardly in a perpendicular second dimension (parallel to directions 44) as flexible circuit substrate 22 is stretched in directions 42. Because circuit substrate 22 stretches outwardly in directions 44 as structure 12 and circuit substrate 22 are stretched in directions 42, substrate 22 and the components 24 on substrate 22 will expend outwardly by equal amounts. The pitch (center-to-center spacing) of components 24 may increase, but pitch expansion will occur equally in the dimension parallel to directions 42 and in the orthogonal dimension parallel to directions 44 so the array of components 24 on substrate 22 will not become distorted and will not produce distorted images.

Materials that exhibit equal expansion in orthogonal directions when stretched (e.g., structures that become thicker/wider perpendicular to applied force when stretched) are characterized by a negative Poisson's ratio and may sometimes be referred to as auxetics. Distortion of the array of components 24 in component 16 can therefore be minimized by forming component 16 from an auxetic flexible circuit substrate. In general, substrate 22 may be provided with any suitable patterns of component mounting regions and interconnect paths 22I that form an auxetic flexible circuit substrate. For example, substrate 22 may be formed from an auxetic mesh-shaped patterned polyimide layer or other substrate shape in which paths 22I help laterally press apart substrate 22 when stretched.

Figure 15:
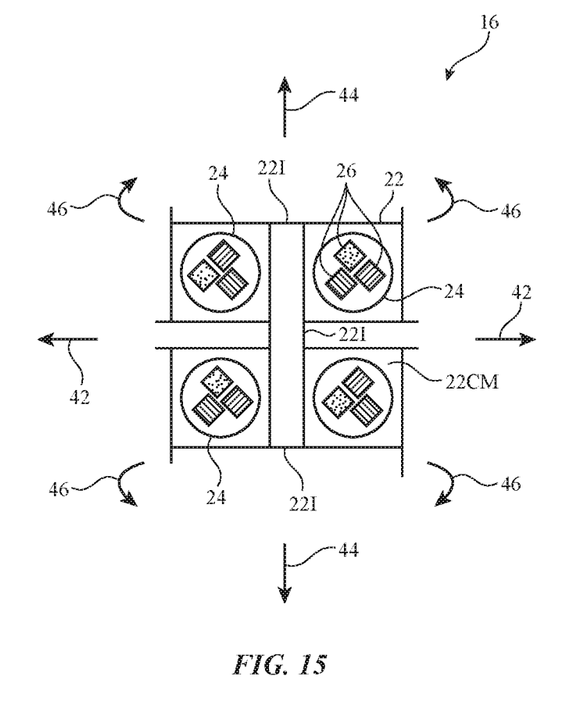
FIG. 15 is a diagram of an illustrative auxetic mesh flexible circuit substrate in an unstretched configuration in accordance with an embodiment.
Figure 16:
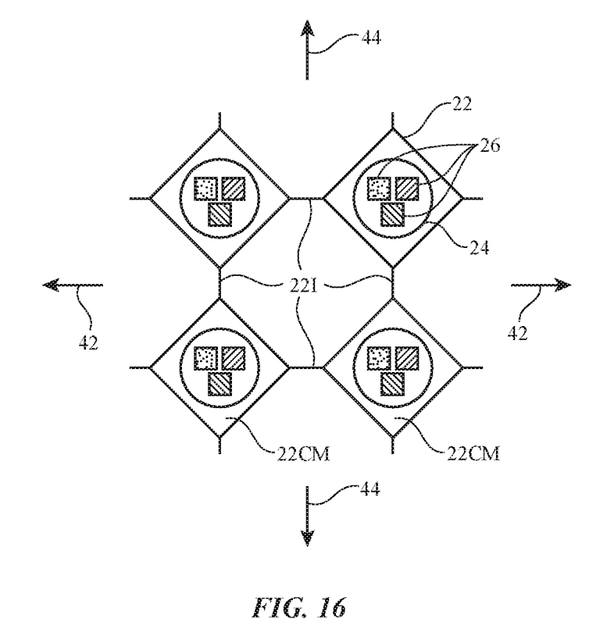
FIG. 16 is a diagram of the auxetic mesh flexible circuit substrate of FIG. 15 when stretched in accordance with an embodiment.

FIGS. 15 and 16 are top views of an illustrative flexible circuit substrate 22 that has an auxetic configuration. Initially, substrate 22 may have an unexpanded configuration of the type shown in FIG. 15. When substrate 22 of FIG. 15 is stretched outwardly in directions 42, each component mounting region 22CM will rotate, as shown by arrows 46 of FIG. 15. This causes elongated interconnect paths 22I to move into the configuration of FIG. 16 so that component mounting regions 22CM and components 24 on regions 22CM are moved outwardly in direction 44 and so that substrate 22 expands equally in both directions 42 and directions 44. Interconnect paths 22I may be elongated straight segments (as shown in FIG. 16) or may have elongated serpentine shapes as shown in FIG. 2. Substrates such as substrates 22 of FIGS. 15 and 16 may sometimes be referred to as auxetic mesh substrates because interconnect paths 22I form a two-dimensional lattice interconnecting a two-dimensional array of component mounting regions 22CM and components 24.

Figure 17:
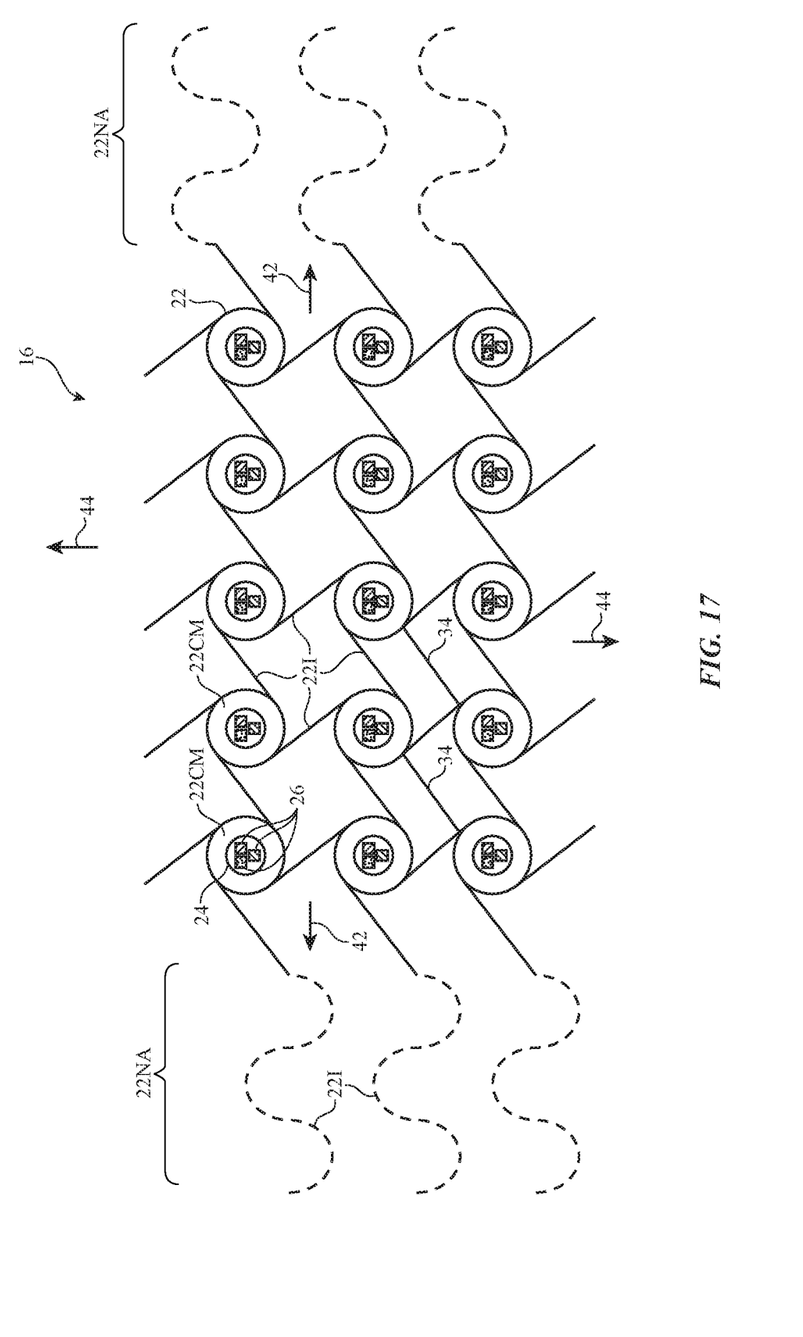
FIGS. 17, 18, and 19 are diagrams of additional illustrative patterns that may be used for forming auxetic mesh flexible printed circuit substrates in accordance with embodiments.
Figure 18:
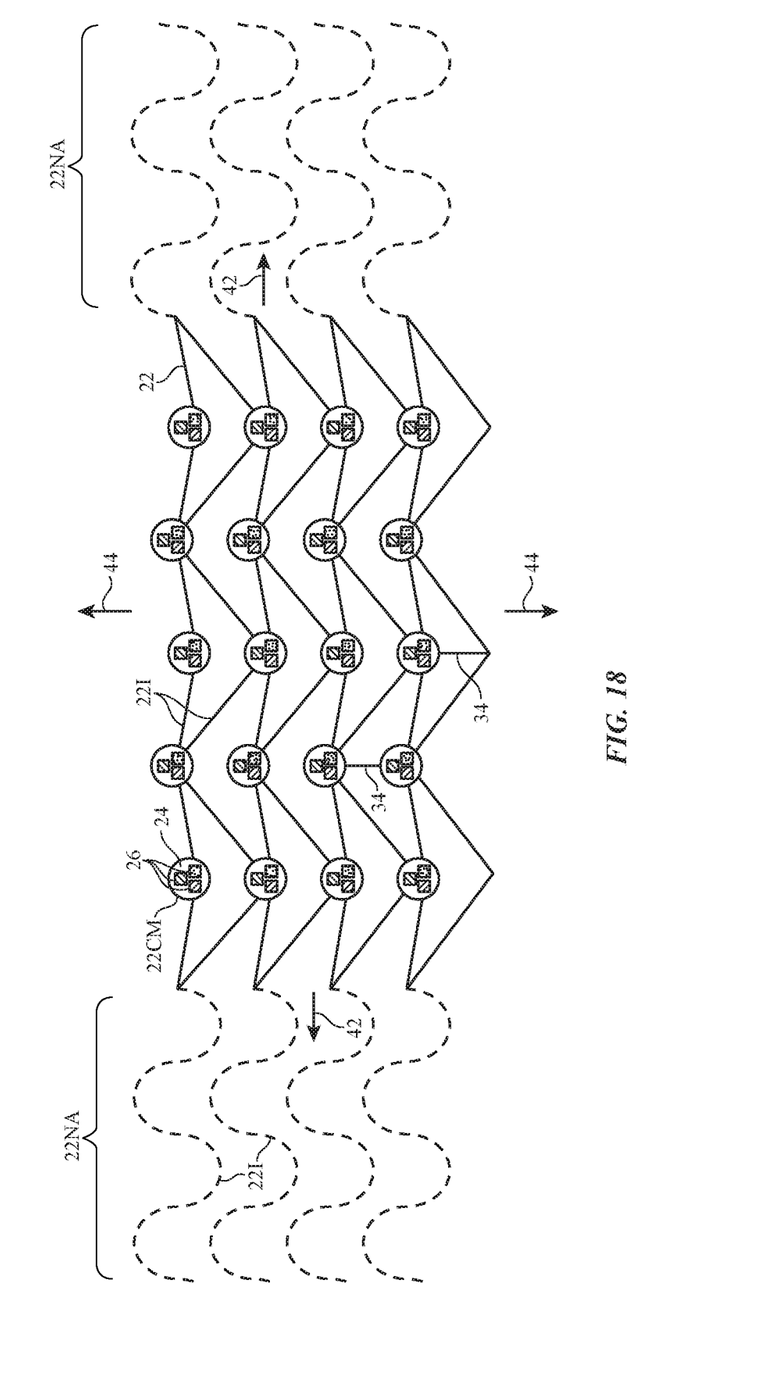
Figure 19:
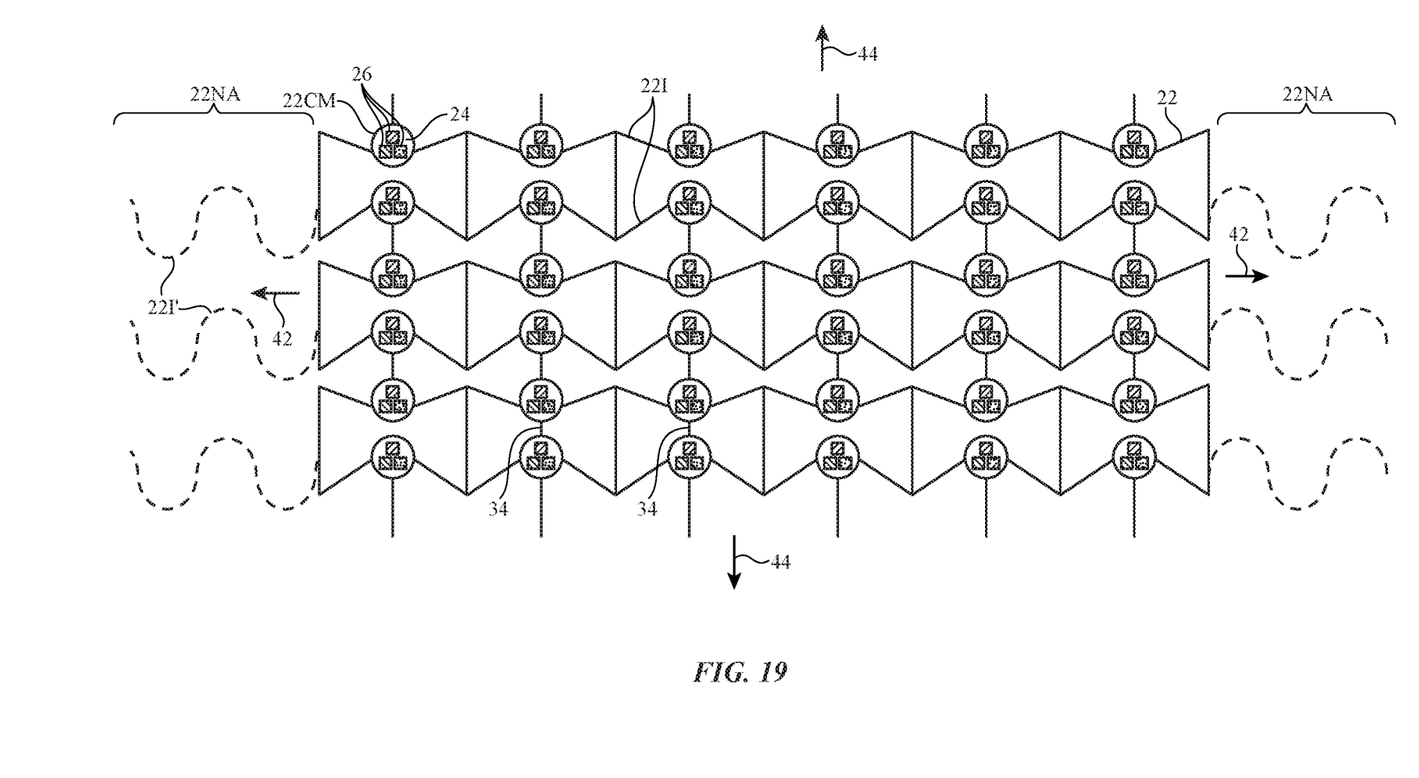

Additional illustrative mesh-shaped flexible circuit substrates 22 for component 16 are shown in FIGS. 17, 18, and 19. As shown in FIGS. 17, 18, and 19, substrate 22 may have various different auxetic mesh patterns that expand equally in directions 44 and 42 when stretched in direction 42. The flexible circuit substrate may, if desired, include optional non-auxetic portions 22NA (i.e., flexible substrate regions with positive Poisson's ratio) formed from serpentine interconnect paths 22I' or other suitable substrate material. As shown in FIGS. 17, 18, and 19, temporary tethers 34 may, if desired, be used in holding paths 22I and/or 22I' of the flexible circuit substrates of FIGS. 17, 18, and 19 together as components 16 are assembled with structures 12 to form item 10.

The foregoing is merely illustrative and various modifications can be made to the described embodiments. The foregoing embodiments may be implemented individually or in any combination.

What is claimed is:

1. A flexible component, comprising:
   a flexible circuit substrate having a plurality of component mounting regions interconnected by flexible interconnect paths;
   temporary tethers that are configured to temporarily couple the component mounting regions together and strengthen the flexible circuit substrate when the temporary tethers are in an unbroken state, wherein the temporary tethers are broken during assembly of the flexible component into an item, wherein the temporary tethers are configured to remain in a broken state within the item, and wherein the temporary tethers are interspersed between the flexible interconnect paths;

metal lines in the flexible circuit substrate; and electrical components that are mounted to the component mounting regions and that are interconnected by the metal lines.

2. The flexible component defined in claim 1 wherein each of the temporary tethers has a narrowed region that facilitates breaking of the temporary tethers.

3. The flexible component defined in claim 2 wherein the electrical components each include at least one light-emitting diode.

4. The flexible component defined in claim 3 wherein the flexible circuit substrate comprises a polyimide layer, wherein the flexible interconnect paths comprise serpentine portions of the polyimide layer that extend from the component mounting regions, and wherein the temporary tethers are formed from integral portions of the polyimide layer.

5. The flexible component defined in claim 1 wherein the flexible circuit substrate is an elongated flexible circuit substrate having a longitudinal axis, wherein the component mounting regions extend along the longitudinal axis, wherein the component mounting regions include adjacent pairs of component mounting regions, wherein each pair of adjacent component mounting regions is coupled by a respective set of the temporary tethers, and wherein each set of temporary tethers includes at least first and second tethers of different strengths.

6. An item, comprising:

a flexible support structure;

an auxetic mesh-shaped flexible circuit substrate having a two-dimensional array of component mounting regions coupled by interconnect paths, wherein the flexible circuit substrate comprises a polymer, wherein portions of the flexible circuit substrate form temporary tethers, wherein the temporary tethers are configured to temporarily couple the component mounting regions together and strengthen the flexible circuit substrate when the temporary tethers are in an unbroken state, wherein the temporary tethers are broken during assembly of the item, and wherein the temporary tethers are configured to remain in a broken state within the item; and an array of electrical components, wherein each electrical component is mounted to a respective one of the component mounting regions and is interconnected to at least one other of the electrical components with metal traces in the auxetic mesh-shaped flexible circuit substrate and wherein each electrical component comprises at least one light-emitting diode.

7. The item defined in claim 6 wherein the auxetic mesh-shaped flexible circuit substrate comprises polyimide and wherein each electrical component includes at least one crystalline semiconductor die.

8. The item defined in claim 7 wherein each crystalline semiconductor die comprises the at least one light-emitting diode.

9. The item defined in claim 6 wherein the flexible support structure comprises fabric.

10. The item defined in claim 6 wherein each temporary tether has a portion coupled to one of the interconnect paths.

11. The item defined in claim 6 wherein each electrical component comprises a communications circuit and at least three light-emitting diodes.

12. The item defined in claim 11 wherein each of the light-emitting diodes has a different color and is formed from a respective crystalline semiconductor die.

13. The item defined in claim 12 wherein the support structure comprises strands of material and is configured to stretch.

14. The item defined in claim 6 wherein the electrical components include sensors.

15. The item defined in claim 6 further comprising a non-auxetic flexible circuit substrate structure coupled to the auxetic flexible circuit substrate.

* * * * *